(12) United States Patent
Steffka

(10) Patent No.: US 9,847,630 B1
(45) Date of Patent: Dec. 19, 2017

(54) LOCKING AND RETAINING STRUCTURE FOR ATTACHING FUSE BOX TO BATTERY TRAY

(71) Applicant: Sumitomo Wiring Systems, Ltd., Yokkaichi, Mie (JP)

(72) Inventor: Aaron Mark Steffka, Livonia, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/428,837

(22) Filed: Feb. 9, 2017

(51) Int. Cl.
- H05K 5/00 (2006.01)
- H02G 3/08 (2006.01)
- B62D 25/08 (2006.01)
- H01H 85/20 (2006.01)
- B60R 16/023 (2006.01)

(52) U.S. Cl.
CPC ........... H02G 3/08 (2013.01); B60R 16/0239 (2013.01); B62D 25/082 (2013.01); H01H 85/20 (2013.01); H05K 5/0073 (2013.01); B60Y 2410/10 (2013.01)

(58) Field of Classification Search
CPC .......................... B60R 16/0239; H05K 5/0073
See application file for complete search history.

(56) References Cited

U.S. PATENT DOCUMENTS

| | | | | |
|---|---|---|---|---|
| 6,547,572 B1* | 4/2003 | Burdick | .............. | B60R 16/0238 439/76.2 |
| 6,619,995 B1* | 9/2003 | Hayashi | ............... | H01R 13/518 439/364 |
| 8,184,438 B2* | 5/2012 | Kaneko | .............. | H05K 7/20854 165/80.2 |
| 8,704,109 B2* | 4/2014 | Demma | .............. | B60R 16/0239 174/541 |
| 2002/0043876 A1* | 4/2002 | Kawaguchi | ......... | B60R 16/0239 307/10.1 |
| 2002/0197893 A1* | 12/2002 | Hiroyuki | ............ | G01R 31/2808 439/74 |
| 2003/0058617 A1* | 3/2003 | Lacroix | ............... | B60R 16/0239 361/688 |

(Continued)

FOREIGN PATENT DOCUMENTS

| | | |
|---|---|---|
| JP | 2007022380 A | 2/2007 |
| JP | 2012116253 A | 6/2012 |
| JP | 2016179754 A | 10/2016 |

*Primary Examiner* — Hung V Ngo
(74) *Attorney, Agent, or Firm* — Dinsmore & Shohl LLP

(57) ABSTRACT

An attachment assembly joining a fuse box and battery tray includes a fuse box having a mounting structure having a fuse bottom surface including a retainer structure joined therewith. The retainer structure includes a cylindrical boss having an attachment wall disposed within the cylindrical boss. A cutout is formed in the cylindrical boss. A battery tray includes a tray bottom surface. The tray bottom surface includes a mating structure including a pair of spaced annular walls extending therefrom defining a gap. Each of the annular walls includes notches formed therein. A J-nut is positioned in the cut out of the cylindrical boss and over an edge of the attachment wall retaining the J-nut on the attachment wall. The cylindrical boss is disposed between the pair of spaced annular walls in the gap and the cutout is aligned with the notches. The J-nut is positioned in the cut out and the notches rotatively aligning the battery tray relative to the fuse box.

20 Claims, 6 Drawing Sheets

(56) References Cited

U.S. PATENT DOCUMENTS

| | | | | |
|---|---|---|---|---|
| 2006/0289664 A1* | 12/2006 | Tomikawa | .......... | B60R 16/0239 237/12.3 R |
| 2007/0117420 A1* | 5/2007 | Kinoshita | ............... | B60R 11/02 439/76.2 |
| 2010/0025978 A1* | 2/2010 | Tomizawa | .......... | B60R 16/0239 280/851 |
| 2010/0319951 A1* | 12/2010 | Nakayama | .......... | B60R 16/0239 174/50 |
| 2010/0326692 A1* | 12/2010 | Ozawa | ................ | B60R 16/0239 174/50.52 |
| 2012/0097693 A1* | 4/2012 | Takeuchi | ............ | B60R 16/0239 220/810 |

* cited by examiner

LOCKING AND RETAINING STRUCTURE FOR ATTACHING FUSE BOX TO BATTERY TRAY

FIELD OF THE INVENTION

The invention relates to attachment structures for attaching a fuse box to a battery tray in a vehicle.

BACKGROUND OF THE INVENTION

Current fuse box structures are generally attached to brackets or brace structures within the engine compartment of a vehicle. Typically, such fuse boxes are attached using weld nuts, bolts and nuts or other retainers attached to the frame of the engine compartment.

Engine compartments are becoming a crowded space with many components. Attachment of the various components within the engine compartment requires carefully packaging the various components.

In order to accommodate attachment of the various components within the engine compartment it may desirable to attachment components to each other. Batteries and fuse boxes are often positioned in an engine compartment. It may be desirable to attach a fuse box to a battery tray holding a battery allowing for efficient packaging within the engine compartment. There is therefore a need to both align and retain a fuse box in a desired position on a battery tray.

SUMMARY OF THE INVENTION

In one aspect, there is disclosed an attachment assembly joining a fuse box and battery tray that includes a fuse box having a mounting structure having a fuse bottom surface including a retainer structure joined therewith. The retainer structure includes a cylindrical boss having an attachment wall disposed within the cylindrical boss. A cutout is formed in the cylindrical boss. A battery tray includes a tray bottom surface. The tray bottom surface includes a mating structure including a pair of spaced annular walls extending therefrom defining a gap. Each of the annular walls includes notches formed therein. A J-nut is positioned in the cut out of the cylindrical boss and over an edge of the attachment wall retaining the J-nut on the attachment wall. The cylindrical boss is disposed between the pair of spaced annular walls in the gap and the cutout is aligned with the notches. The J-nut is positioned in the cut out and the notches rotatively aligning the fuse box relative to the battery tray.

In another aspect there is disclosed, an attachment assembly joining a fuse box and battery tray that includes a fuse box having a mounting structure having a fuse bottom surface including a retainer structure joined therewith. The retainer structure includes a cylindrical boss having an attachment wall disposed within the cylindrical boss. A cutout is formed in the cylindrical boss. A battery tray includes a tray bottom surface. The tray bottom surface includes a mating structure including a pair of spaced annular walls extending therefrom defining a gap. Each of the annular walls includes notches formed therein. A slot is formed in the attachment wall and an attachment slot is formed in the tray bottom surface. The slot and attachment slot are aligned at centers relative to each other along a vertical axis.

A J-nut is positioned in the cut out of the cylindrical boss and over an edge of the attachment wall retaining the J-nut on the attachment wall. The cylindrical boss is disposed between the pair of spaced annular walls in the gap and the cutout is aligned with the notches. The J-nut is positioned in the cut out and the notches rotatively aligning the fuse box relative to the battery tray. The J-nut includes a tapped extruded portion aligned at a center with the slot formed in the attachment wall. A fastener is passed through the slot in the bottom tray surface and is threaded with the tapped extrusion portion joining the fuse box and battery tray.

In yet another aspect there is disclosed, there is disclosed an attachment assembly joining a fuse box and battery tray that includes a fuse box having a mounting structure having a fuse bottom surface including a retainer structure joined therewith. The retainer structure includes a cylindrical boss having an attachment wall disposed within the cylindrical boss. A cutout is formed in the cylindrical boss. A battery tray includes a tray bottom surface. The tray bottom surface includes a mating structure including a pair of spaced annular walls extending therefrom defining a gap. Each of the annular walls includes notches formed therein. A J-nut is positioned in the cut out of the cylindrical boss and over an edge of the attachment wall retaining the J-nut on the attachment wall. The cylindrical boss is disposed between the pair of spaced annular walls in the gap and the cutout is aligned with the notches. The J-nut is positioned in the cut out and the notches rotatively aligning the fuse box relative to the battery tray. An attachment tab is joined with the battery tray. The attachment tab is coupled to to vehicle structure.

DETAILED DESCRIPTION OF THE PREFERRED EMBODIMENTS

Figure 1:
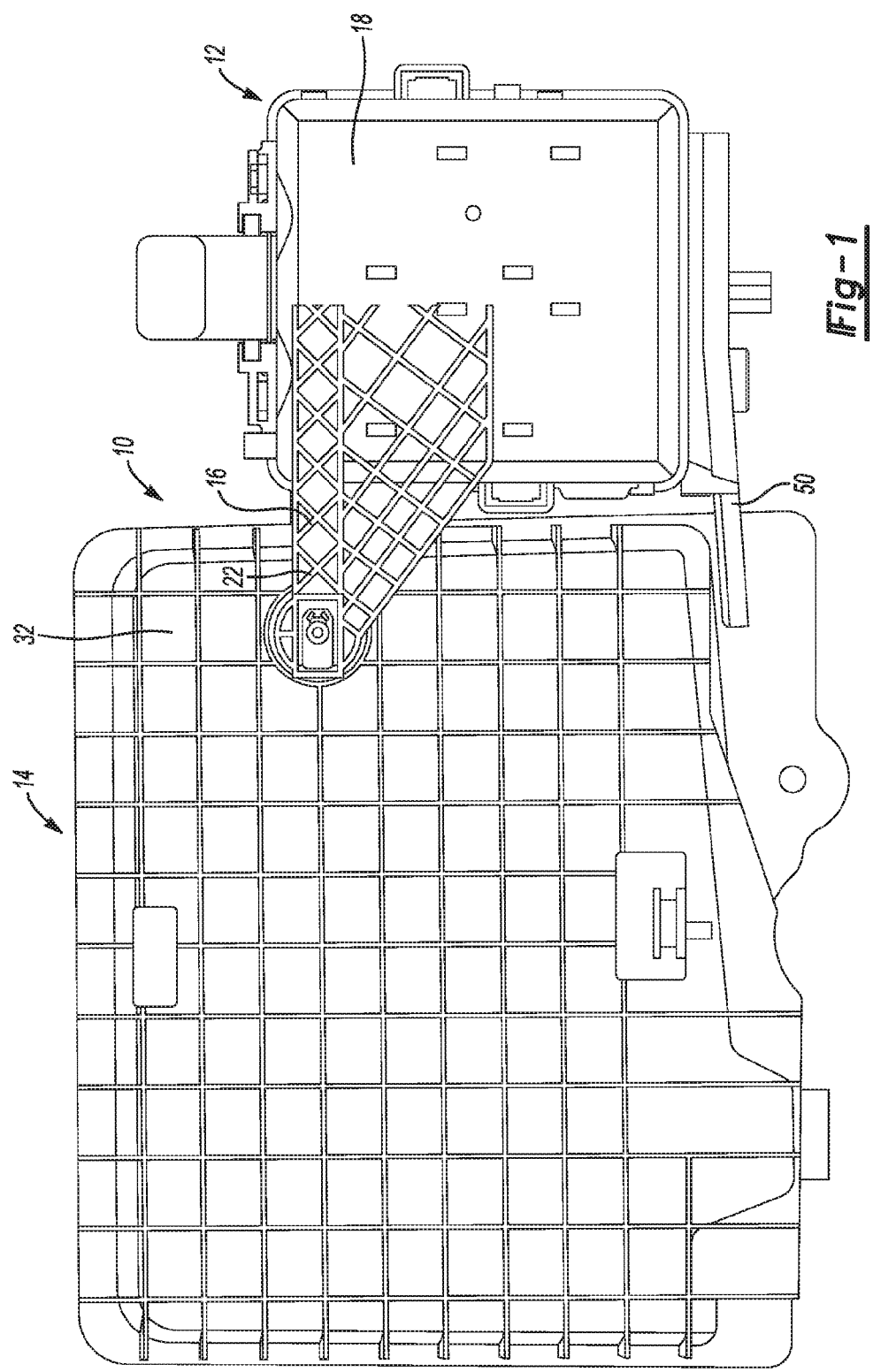
FIG. 1 is a bottom view of a fuse box and battery tray joined.

Referring to the figures there is shown an attachment assembly 10 joining a fuse box 12 and battery tray 14. The fuse box 12 includes a mounting structure 16 having a fuse bottom surface 18 including a retainer structure 20 joined therewith. In one aspect, the retainer structure 20 may be monolithically formed on an extension arm 22 attached to the fuse box 12 or separately attached to the mounting structure 16.

The retainer structure 20 includes a cylindrical boss 24 having an attachment wall 26 disposed within the cylindrical boss 24. A cutout 28 is formed in the cylindrical boss 24. The attachment wall 26 may include a slot 30 formed therein.

The battery tray 14 includes a tray bottom surface 32. The tray bottom surface 32 includes a mating structure 34 having a pair of spaced annular walls 36 extending therefrom defining a gap 38. Each of the spaced annular walls 36 includes notches 40 formed therein. The tray bottom surface 32 may include an attachment slot 42 formed therein. In one aspect, the slot 30 and attachment slot 42 are aligned at centers relative to each other along a vertical axis.

A J-nut 44 is positioned in the cut out 28 of the cylindrical boss 24 and over an edge 46 of the attachment wall 26 retaining the J-nut 44 on the attachment wall 26. When assembled, the cylindrical boss 24 is disposed between the pair of spaced annular walls 36 in the gap 38 and the cutout 28 is aligned with the notches 40. The J-nut 44 is positioned in the cut out 28 and the notches 40 rotatively aligning the battery tray 14 relative to the fuse box 12.

Figure 2:
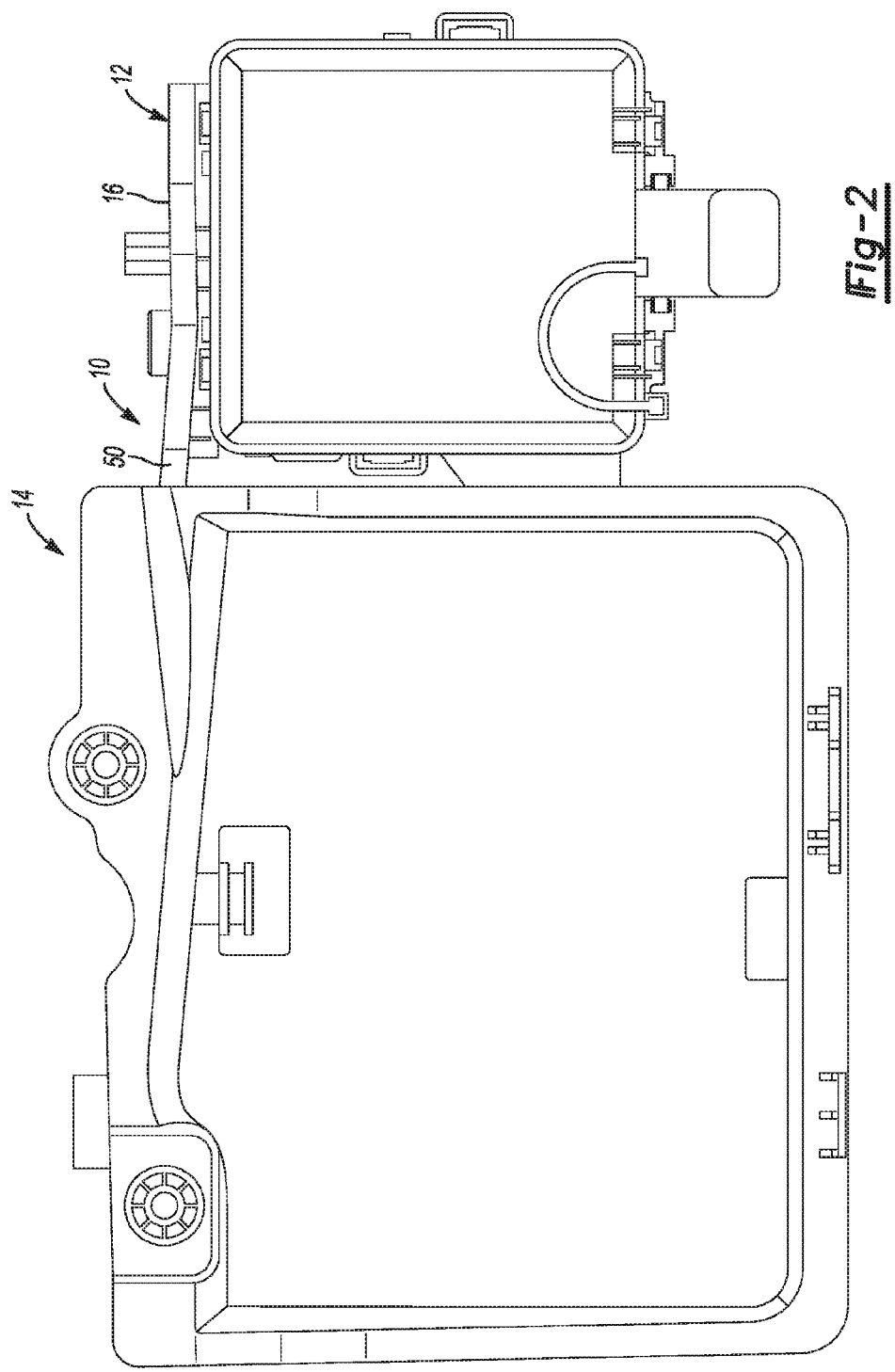
FIG. 2 is a top view of a fuse box and battery tray joined.
Figure 3:
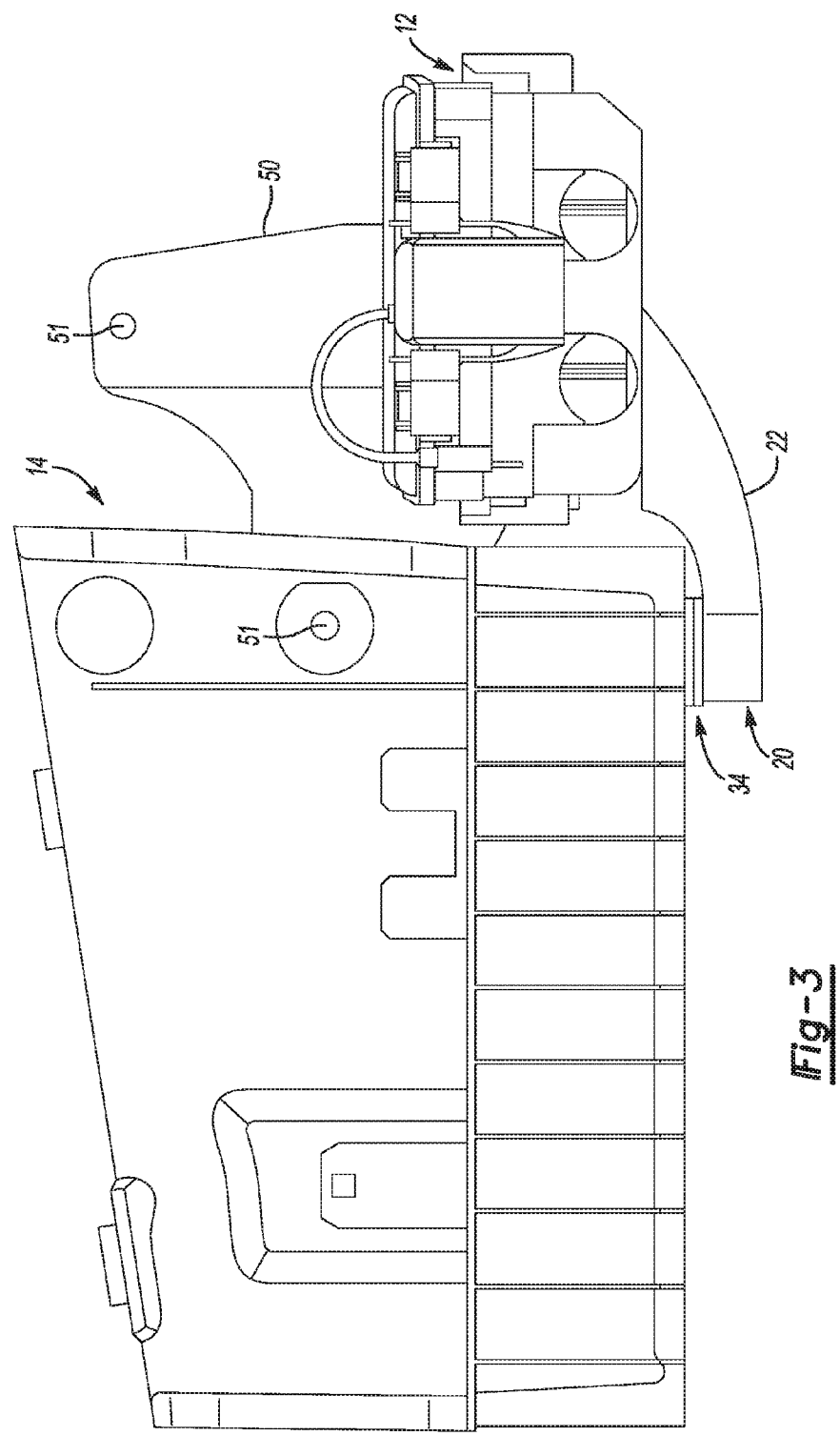
FIG. 3 is a side view of a fuse box and battery tray joined.

The rotative alignment may be defined by contact of edges 46 of the J-nut 44 with edge surfaces 48 of the notches 40. The rotative alignment may be utilized to position the battery tray 14. The attachment tab 50 may be monolithically formed with the mounting structure 16 as shown in FIGS. 1-3 or the attachment tab 50 may be separately attached to the mounting structure 16. The attachment tab 50 may be coupled to the vehicle structure at defined locations 51.

Figure 4:
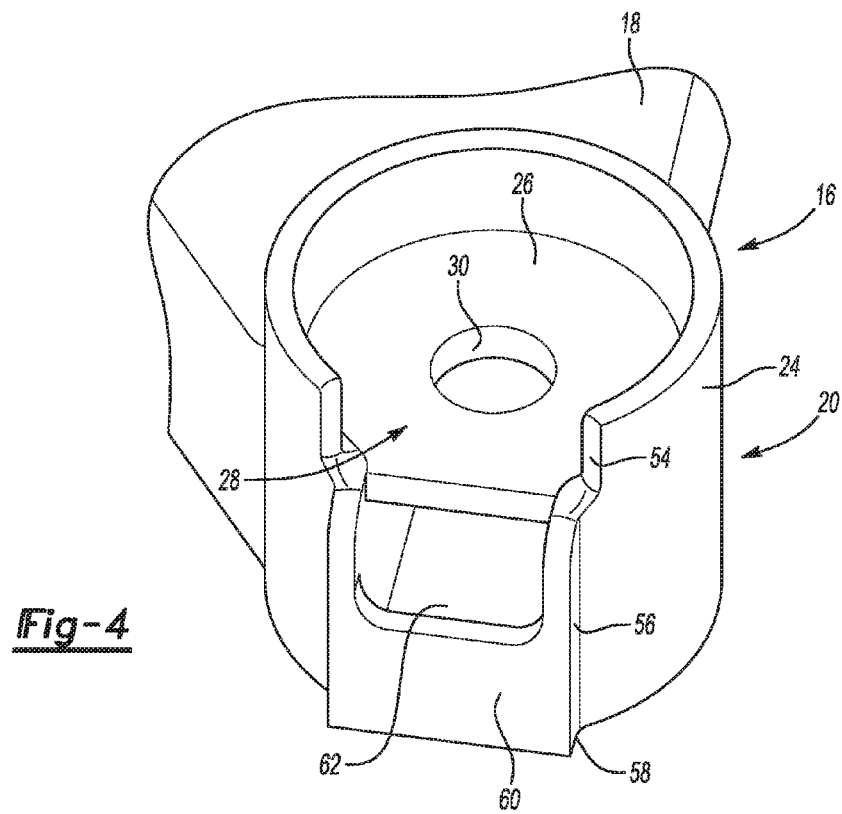
FIG. 4 is a partial perspective view of a retainer structure.
Figure 6:
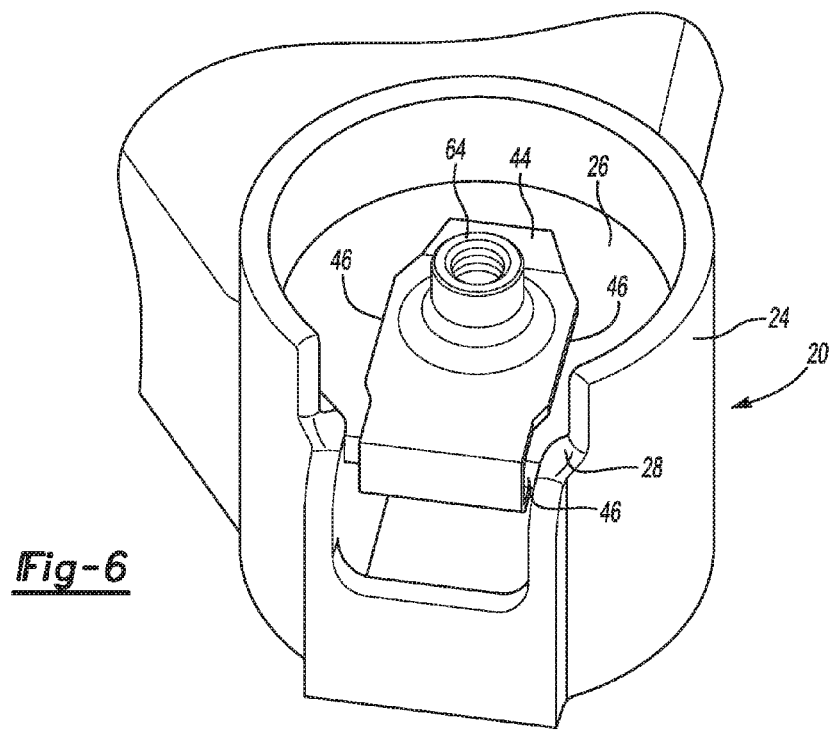
FIG. 6 is a partial perspective view of a retainer structure and J-nut.

Referring to FIGS. 4 and 6, the retainer structure 20 of the fuse box 12 is shown. The retainer structure 20 includes a cylindrical boss 24 having an attachment wall 26 disposed within the cylindrical boss 24. The cutout 30 formed in the cylindrical boss 24 may include an upper portion 54. The upper portion 54 is defined by local removal of the cylindrical boss 24. A lower portion 56 of the cutout 30 may include cutout side walls 58 extending radially outward from the cylindrical boss 24 that are joined by a face wall 60. The face wall 60 includes a passage 62 allowing the J-nut 44 to pass there through.

Referring to FIG. 6, the J-nut 44 includes a tapped extruded portion 64 aligned at a center with the slot 30 formed in the attachment wall 26 wherein a fastener 66 is passed through the slot 30 in the bottom tray surface and is threaded with the tapped extrusion portion 64 joining the fuse box 12 and battery tray 14. In one aspect, the J-nut 44 includes a spring tab 68 formed thereon that is received in the slot 30 aligning the tapped extrusion 64 with the slot 30.

Figure 5:
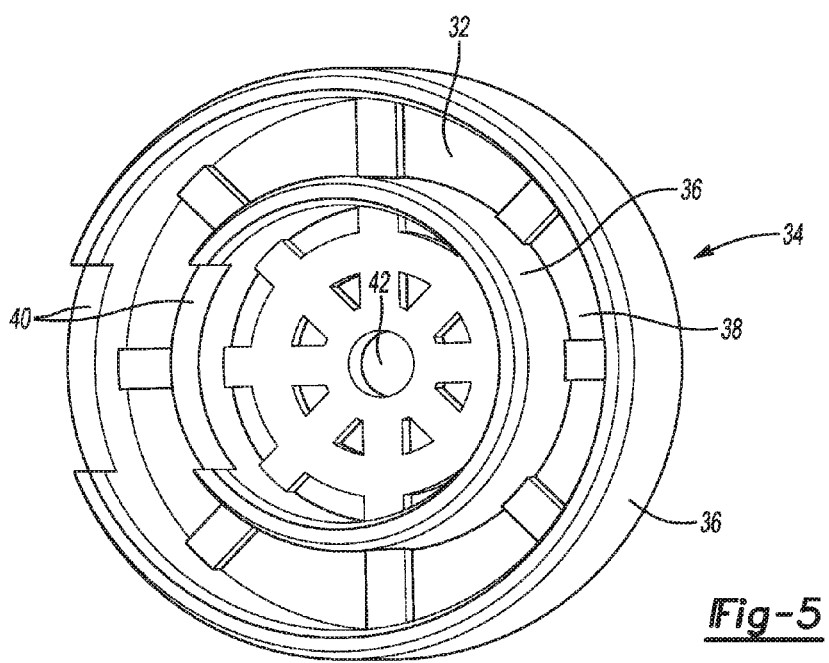
FIG. 5 is a partial perspective view of a mating structure.
Figure 7:
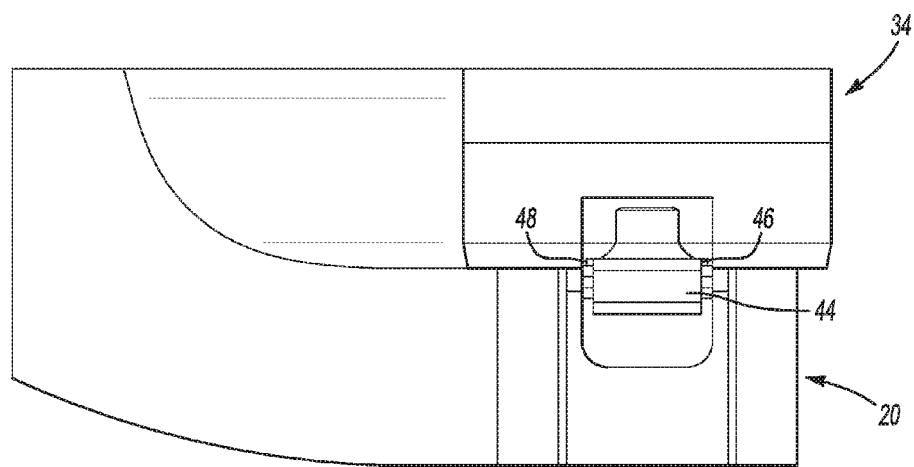
FIG. 7 is a partial perspective view of a retainer structure, mating structure and J-nut.
Figure 8:
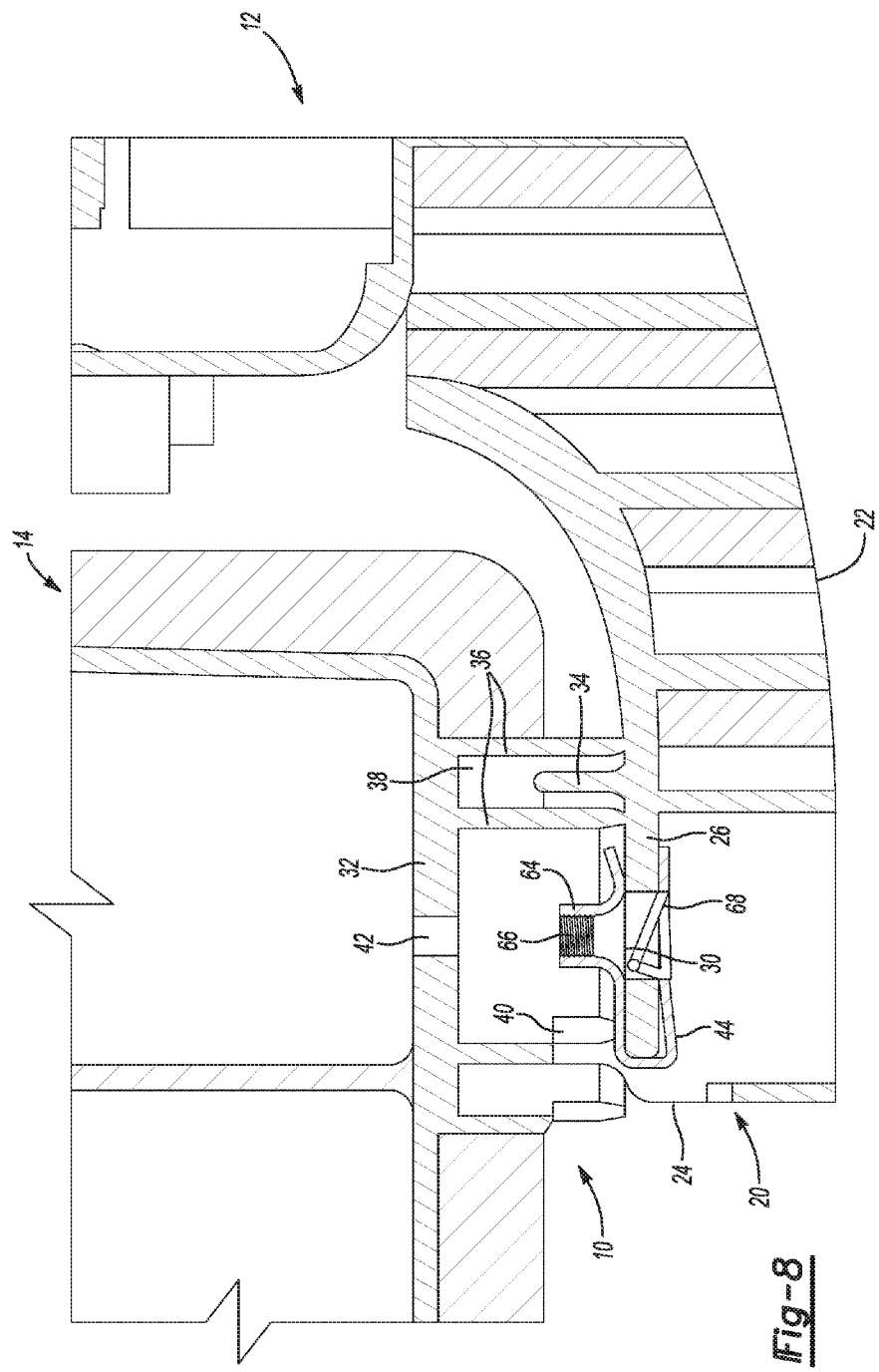
FIG. 8 is a partial offset sectional view of a retainer structure, mating structure and J-nut coupled.

Referring to FIGS. 5 and 7-8, the mating structure of the battery tray 14 is shown. As described above, the tray bottom surface 32 includes a mating structure 34 having a pair of spaced annular walls 36 extending therefrom defining a gap 38. Each of the spaced annular walls 36 includes notches 40 formed therein. The tray bottom surface 32 may include an attachment slot 42 formed therein. In one aspect, the slot 30 and attachment slot 42 are aligned at centers relative to each other along a vertical axis. As best shown in FIG. 8, in one aspect, a height of the cylindrical attachment boss 24 is less than a depth of the gap 38. Additionally, the notches 40 include a height greater than a height of the tapped extrusion 64 formed on the J-nut 44.

In use, the attachment tab 50 of the fuse box 12 may be coupled to the vehicle structure at defined locations 51. Following connection of the attachment tab 50, the battery tray 14 may be positioned such that the cylindrical boss 24 is disposed between the pair of spaced annular walls 36 in the gap 38 and the cutout 28 is aligned with the notches 40. A J-nut 44 is positioned in the cut out 28 of the cylindrical boss 24 and over an edge 46 of the attachment wall 26 retaining the J-nut 44 on the attachment wall 26. When assembled, the cylindrical boss 24 is disposed between the pair of spaced annular walls 36 in the gap 38 and the cutout 28 is aligned with the notches 40. The J-nut 44 is positioned in the cut out 28 and the notches 40 rotatively aligning the battery tray 14 relative to the fuse box 12. In one aspect, the J-nut 44 includes a spring tab 66 formed thereon that is received in the slot 30 aligning the tapped extrusion 64 with the slot 30. The J-nut 44 includes a tapped extruded portion 64 aligned at a center with the slot 30 formed in the attachment wall 26 wherein a fastener 66 is passed through the slot 30 in the bottom tray surface 32 and is threaded with the tapped extrusion portion 64 joining the fuse box 12 and battery tray 14.

I claim:

1. An attachment assembly joining a fuse box and battery tray comprising:
   a fuse box including a mounting structure having a fuse bottom surface including a retainer structure joined therewith, the retainer structure including a cylindrical boss having an attachment wall disposed within the cylindrical boss, a cutout formed in the cylindrical boss;
   a battery tray including a tray bottom surface, the tray bottom surface including a mating structure including a pair of spaced annular walls extending therefrom defining a gap, each of the annular walls including notches formed therein;
   a J-nut positioned in the cut out of the cylindrical boss and over an edge of the attachment wall retaining the J-nut on the attachment wall;
   wherein the cylindrical boss is disposed between the pair of spaced annular walls in the gap and the cutout is aligned with the notches and the J-nut is positioned in the cut out and the notches rotatively aligning the battery tray relative to the fuse box.

2. The attachment assembly of claim 1 further including a slot formed in the attachment wall and an attachment slot formed in the tray bottom surface, the slot and attachment slot aligned at centers relative to each other along a vertical axis.

3. The attachment assembly of claim 2 wherein the J-nut includes a tapped extruded portion aligned at a center with the slot formed in the attachment wall wherein a fastener is passed through the slot in the bottom tray surface and is threaded with the tapped extrusion portion joining the fuse box and battery tray.

4. The attachment assembly of claim 2 wherein the J-nut includes a spring tab formed thereon, the spring tab received in the slot aligning the tapped extrusion with the slot.

5. The attachment assembly of claim 1 further including an attachment tab joined with the battery tray, the attachment tab coupled to a vehicle structure.

6. The attachment assembly of claim 1 further including an extension arm attached to the fuse box, the retainer structure formed on the extension arm.

7. The attachment assembly of claim 1 wherein a height of the cylindrical attachment boss is less than a depth of the gap.

8. The attachment assembly of claim 1 wherein the notches include a height greater than a height of a tapped extrusion formed on the J-nut.

9. An attachment assembly joining a fuse box and battery tray comprising:
   a fuse box including a mounting structure having a fuse bottom surface including a retainer structure joined therewith, the retainer structure including a cylindrical boss having an attachment wall disposed within the cylindrical boss, a cutout formed in the cylindrical boss;
   a battery tray including a tray bottom surface, the tray bottom surface including a mating structure including a pair of spaced annular walls extending therefrom defining a gap, each of the annular walls including notches formed therein;

a slot formed in the attachment wall and an attachment slot formed in the tray bottom surface, the slot and attachment slot aligned at centers relative to each other along a vertical axis;

a J-nut positioned in the cut out of the cylindrical boss and over an edge of the attachment wall retaining the J-nut on the attachment wall;

wherein the cylindrical boss is disposed between the pair of spaced annular walls in the gap and the cutout is aligned with the notches and the J-nut is positioned in the cut out and the notches rotatively aligning the battery tray relative to the fuse box wherein the J-nut includes a tapped extruded portion aligned at a center with the slot formed in the attachment wall wherein a fastener is passed through the slot in the bottom tray surface and is threaded with the tapped extrusion portion joining the fuse box and battery tray.

10. The attachment assembly of claim 9 wherein the J-nut includes a spring tab formed thereon, the spring tab received in the slot aligning the tapped extrusion with the slot.

11. The attachment assembly of claim 9 further including an attachment tab joined with the battery tray, the attachment tab coupled to a vehicle structure.

12. The attachment assembly of claim 9 further including an extension arm attached to the fuse box, the retainer structure formed on the extension arm.

13. The attachment assembly of claim 9 wherein a height of the cylindrical attachment boss is less than a depth of the gap.

14. The attachment assembly of claim 9 wherein the notches include a height greater than a height of the tapped extrusion.

15. An attachment assembly joining a fuse box and battery tray comprising:

a fuse box including a mounting structure having a fuse bottom surface including a retainer structure joined therewith, the retainer structure including a cylindrical boss having an attachment wall disposed within the cylindrical boss, a cutout formed in the cylindrical boss;

a battery tray including a tray bottom surface, the tray bottom surface including a mating structure including a pair of spaced annular walls extending therefrom defining a gap, each of the annular walls including notches formed therein;

a J-nut positioned in the cut out of the cylindrical boss and over an edge of the attachment wall retaining the J-nut on the attachment wall;

wherein the cylindrical boss is disposed between the pair of spaced annular walls in the gap and the cutout is aligned with the notches and the J-nut is positioned in the cut out and the notches rotatively aligning the battery tray relative to the fuse box wherein an attachment tab is joined with the battery tray, the attachment tab coupled to a vehicle structure.

16. The attachment assembly of claim 15 further including a slot formed in the attachment wall and an attachment slot formed in the tray bottom surface, the slot and attachment slot aligned at centers relative to each other along a vertical axis.

17. The attachment assembly of claim 16 wherein the J-nut includes a tapped extruded portion aligned at a center with the slot formed in the attachment wall wherein a fastener is passed through the slot in the bottom tray surface and is threaded with the tapped extrusion portion joining the fuse box and battery tray.

18. The attachment assembly of claim 17 wherein a height of the cylindrical attachment boss is less than a depth of the gap and wherein the notches include a height greater than a height of the tapped extrusion.

19. The attachment assembly of claim 16 wherein the J-nut includes a spring tab formed thereon, the spring tab received in the slot aligning the tapped extrusion with the slot.

20. The attachment assembly of claim 15 further including an extension arm attached to the fuse box, the retainer structure formed on the extension arm.

* * * * *